United States Patent
Chazan

(10) Patent No.: US 6,752,966 B1
(45) Date of Patent: Jun. 22, 2004

(54) MICROFABRICATION METHODS AND DEVICES

(75) Inventor: David Chazan, Palo Alto, CA (US)

(73) Assignee: Caliper Life Sciences, Inc., Mountain View, CA (US)

(*) Notice: Subject to any disclaimer, the term of this patent is extended or adjusted under 35 U.S.C. 154(b) by 515 days.

(21) Appl. No.: 09/654,603

(22) Filed: Sep. 1, 2000

Related U.S. Application Data

(63) Continuation-in-part of application No. 09/394,012, filed on Sep. 10, 1999.

(51) Int. Cl.$^7$ .................................................. B01L 3/00
(52) U.S. Cl. .................. 422/102; 422/99; 422/100; 435/283.1; 435/287.1; 435/287.8; 435/288.3; 435/288.4; 427/421; 427/424
(58) Field of Search .................. 422/68.1, 93, 99, 422/100, 102; 436/149, 164, 174, 180; 427/421, 424; 435/283.1, 287.1, 287.8, 288.3, 288.4

(56) References Cited

U.S. PATENT DOCUMENTS

| | | |
|---|---|---|
| 3,468,331 A | 9/1969 | O'Neal |
| 3,495,604 A | 2/1970 | Trask |
| 3,495,608 A | 2/1970 | O'Keefe |
| 3,528,445 A | 9/1970 | Shinn et al. |
| 3,534,757 A | 10/1970 | Doherty |
| 3,548,849 A | 12/1970 | Purcell et al. |
| 3,587,614 A | 6/1971 | Burke |
| 3,587,615 A | 6/1971 | Thomson |
| 3,658,088 A | 4/1972 | Jensen et al. |
| 3,731,700 A | 5/1973 | Cohen |
| 3,747,628 A | 7/1973 | Holster et al. |
| 3,811,474 A | 5/1974 | Bauer et al. |
| 3,942,558 A | 3/1976 | Honda et al. |
| 4,390,403 A | 6/1983 | Batchelder |
| 4,729,403 A | 3/1988 | Roche |
| 4,908,112 A | 3/1990 | Pace |
| 4,949,755 A | 8/1990 | Thurston et al. |
| 5,126,022 A | 6/1992 | Soane et al. |

(List continued on next page.)

FOREIGN PATENT DOCUMENTS

| | | |
|---|---|---|
| WO | WO 9604547 | 2/1996 |
| WO | WO 9702357 | 1/1997 |

OTHER PUBLICATIONS

U.S. patent application Ser. No. 09/231,209, Chow.

Cohen, C.B. et al., "A Microchip–Based Enzyme Assay for Protein Kinase A," *Anal. Chem.* (1999) 273:89–97.

(List continued on next page.)

*Primary Examiner*—Jill Warden
*Assistant Examiner*—Dwayne K Handy
(74) *Attorney, Agent, or Firm*—Donald R. McKenna

(57) ABSTRACT

Microfabrication methods and devices in which microscale structural elements are provided in an intermediate polymer layer between two planar substrates. Preferred aspects utilize photoimagable or ablatable polymer layers as the intermediate polymer layer.

61 Claims, 4 Drawing Sheets

U.S. PATENT DOCUMENTS

| | | | |
|---|---|---|---|
| 5,417,235 A | 5/1995 | Wise et al. | |
| 5,498,392 A | 3/1996 | Wilding et al. | |
| 5,571,410 A | 11/1996 | Swedberg et al. | |
| 5,585,069 A | 12/1996 | Zanzucchi et al. | |
| 5,593,838 A | 1/1997 | Zanzucchi et al. | |
| 5,603,351 A | 2/1997 | Cherukuri et al. | |
| 5,635,358 A | 6/1997 | Wilding et al. | |
| 5,637,469 A | 6/1997 | Wilding et al. | |
| 5,681,484 A | 10/1997 | Zanzucchi et al. | |
| 5,699,157 A | 12/1997 | Parce | |
| 5,750,015 A | 5/1998 | Soane et al. | |
| 5,779,868 A | 7/1998 | Parce et al. | |
| 5,783,452 A * | 7/1998 | Jons et al. | 436/183 |
| 5,800,690 A | 9/1998 | Chow et al. | |
| 5,842,787 A | 12/1998 | Kopf-Sill et al. | |
| 5,852,495 A | 12/1998 | Parce | |
| 5,869,004 A | 2/1999 | Parce et al. | |
| 5,876,675 A | 3/1999 | Kennedy | |
| 5,879,632 A | 3/1999 | Demers | |
| 5,880,071 A | 3/1999 | Parce et al. | |
| 5,882,465 A | 3/1999 | McReynolds | |
| 5,885,470 A | 3/1999 | Parce et al. | |
| 5,922,591 A | 7/1999 | Anderson et al. | |
| 5,932,799 A * | 8/1999 | Moles | 73/53.01 |
| 5,942,443 A | 8/1999 | Parce et al. | |
| 5,948,227 A | 9/1999 | Dubrow | |
| 5,955,028 A | 9/1999 | Chow | |
| 5,957,579 A | 9/1999 | Kopf-Sill et al. | |
| 5,958,203 A | 9/1999 | Parce et al. | |
| 5,958,694 A | 9/1999 | Nikiforov | |
| 5,959,291 A | 9/1999 | Jensen | |
| 5,962,081 A | 10/1999 | Ohman | |
| 5,964,995 A | 10/1999 | Nikiforov et al. | |
| 5,965,001 A | 10/1999 | Chow et al. | |
| 5,965,237 A | 10/1999 | Bruin et al. | |
| 5,965,410 A | 10/1999 | Chow et al. | |
| 5,972,187 A | 10/1999 | Parce et al. | |
| 5,976,336 A | 11/1999 | Dubrow et al. | |
| 5,989,402 A | 11/1999 | Chow et al. | |
| 6,001,231 A | 12/1999 | Kopf-Sill | |
| 6,004,515 A | 12/1999 | Parce et al. | |
| 6,011,252 A | 1/2000 | Jensen | |
| 6,012,902 A | 1/2000 | Parce | |
| 6,073,482 A | 6/2000 | Moles | |
| 6,136,212 A | 10/2000 | Mastrangelo et al. | |
| 6,167,910 B1 * | 1/2001 | Chow | 137/827 |
| 6,176,962 B1 * | 1/2001 | Soane et al. | 156/292 |
| 6,210,986 B1 * | 4/2001 | Arnold et al. | 438/42 |
| 6,221,654 B1 * | 4/2001 | Quake et al. | 435/287.3 |
| 6,284,072 B1 * | 9/2001 | Ryan et al. | 156/59 |
| 6,375,871 B1 * | 4/2002 | Bentsen et al. | 264/1.6 |
| 6,382,254 B1 * | 5/2002 | Yang et al. | 137/807 |
| 6,489,774 B1 * | 12/2002 | Van De Goor et al. | 324/439 |

OTHER PUBLICATIONS

Dasgupta, P.K. et al., "Electroosmosis: A Reliable Fluid Propulsion System for Flow Injection Analysis," *Anal. Chem.* (1994) 66:1792–1798.

Jacobson, S.C. et al., "Fused Quartz Substrates for Microchip Electrophoresis," *Anal. Chem.* (1995) 67:2059–2063.

Manz, A. et al., "Electroosmotic pumping and electrophoretic separations for miniaturized chemical analysis systems," *J. Micromech.Microeng.* (1994) 4:257–265.

Ramsey, J.M. et al., "Microfabricated chemical measurement systems," *Nature Med.* (1995) 1:1093–1096.

Seiler, K. et al., "Planar Glass Chips for Capillary Electrophoresis: Repetitive Sample Injection, Quantitation, and Separation Efficiency," *Anal. Chem.* (1993) 65:1481–1488.

Seiler, K. et al., "Electroosmotic Pumping and Valveless Control of Fluid Flow Within a Manifold of Capillaries on a Glass Chip," *Anal. Chem.* (1994) 66:3485–3491.

Sundberg, S., "High–throughput and ultra–high–throughput screening: solution– and cell–based approaches," *Current Opinions in Biotechnology* (2000) 11/47–53.

* cited by examiner

MICROFABRICATION METHODS AND DEVICES

CROSS-REFERENCE TO RELATED APPLICATIONS

This application is a continuation-in-part of U.S. patent application Ser. No. 09/394,012, filed Sep. 10, 1999, which is incorporated herein by reference in its entirety for all purposes.

BACKGROUND OF THE INVENTION

Microfluidic technology has been applied to expanding fields of research and analysis in an effort to increase speed, efficiency and accuracy of that research. Typically, microfluidic systems have at their core a microfluidic device, element or cassette which functions as a liquid integrated circuit for moving materials around, mixing, separating and measuring properties of those materials.

A number of different technologies have been applied to the fabrication of these microfluidic devices. For example, initial microfluidic devices were generally fabricated from silicon wafers using photolithographic techniques commonly exploited in the electronics industries. See, e.g., U.S. Pat. No. 4,908,112 to Pace, and Terry et al., IEEE Trans. Electron. Devices (1979) ED-26:1880). In brief, grooves and or depressions are etched into the surface of a first silicon substrate while a second substrate is overlaid on the first, sealing the grooves and depressions to define channels and chambers, respectively, within the device. Glass substrates have also been fabricated in a similar fashion. See, U.S. Pat. No. 5,882,465.

Polymer fabrication methods have also been used in the production of these devices. Specifically, polymeric substrates are provided having grooves fabricated into their surface using, e.g., injection molding techniques, embossing techniques or laser ablation techniques. See U.S. Pat. Nos. 5,885,470 and 5,571,410.

U.S. Pat. No. 5,376,252 to Ekstrom on the other hand describes the use of a flexible gasket or spacer placed between two planar substrates, where channels are defined within the gasket or spacer.

While many of the above-described methods have produced functional microfluidic devices, their exist areas for improving the fabrication process for microfluidic devices, e.g., excessive costs, sensitivity to material defects, and artifacts of fabrication that materially affect the functioning of the device, e.g., channel collapse in polymer substrates, etc.

SUMMARY OF THE INVENTION

The present invention generally provides microfluidic devices and methods of manufacturing same, which utilize an intermediate polymer layer into which the microscale structural elements are defined. The intermediate polymer layer is typically deposited between two planar substrates, and portions of the layer are removed to define the microscale structural elements of the device. Preferred polymer layers are either photoimagable or are laser ablatable.

A further aspect of the present invention is a method of manufacturing a microfabricated channel network. The method includes providing a first planar substrate having a first surface. A first polymer layer is deposited on the first surface of the first substrate. A first portion of the polymer layer is removed to expose an area of the first surface of the first substrate. Removal of the first portion of the polymer layer provides one or more grooves in the polymer layer that correspond to a desired channel pattern. A second planar substrate layer is overlaid on the polymer layer to seal the one or more grooves in the polymer layer as one or more channels in the desired channel pattern.

Another aspect of the present invention is a microfluidic device, comprising a first substrate layer having a first surface. There is a first photoimagable polymer layer on the first surface of the first substrate. The photoimagable polymer layer has at least a first groove disposed therein in a desired location. The device also includes a second planar substrate layer having a first surface. The first surface of the second substrate layer is mated with and overlays the photoimagable polymer layer.

A further aspect of the present invention is a microfluidic device, comprising a first substrate layer having a first surface. There is a first polymer layer on the first surface of the first substrate. The polymer layer has at least a first groove laser ablated entirely through the polymer layer in a desired location without affecting the first surface of the first substrate. There is also a second planar substrate layer having a first surface. The first surface of the second substrate layer is mated with and overlays the photoimagable polymer layer.

The present invention also provides for an analytical system, comprising a microfluidic device. The microfluidic device is comprised of a first substrate layer having a first surface with a first photoimagable polymer layer on the first surface. The photoimagable polymer layer has one or more grooves disposed therein in a desired location. The device also includes a second planar substrate layer having a first surface. The first surface of the second substrate layer is mated with and overlays the photoimagable polymer layer, sealing the one or more grooves to define one or more microscale channels. The system also includes a material transport system for directing movement of material through the one or more microscale channels and a detector for detecting signals from the material.

DETAILED DESCRIPTION OF THE INVENTION

I. General

Figure 1A:
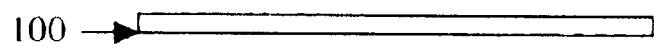
FIG. 1 is a schematic illustration of a fabrication process of the invention using a an intermediate photoimagable polymer layer.
Figure 1B:
Figure 1C:
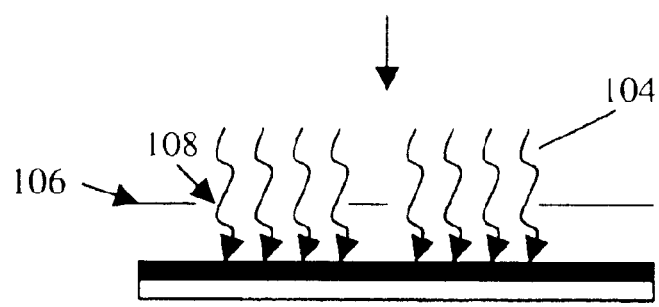

The present invention generally provides novel methods of fabricating devices having body structures that have microscale structures defined within their interior portion. The microscale structures are defined by an intermediate polymer layer in which the microscale structures of the device are fabricated. In particular, a polymer layer is deposited upon a planar substrate, where the intermediate polymer layer is developable (etchable) or ablatable to a different extent than the underlying substrate. The methods of the invention give rise to less expensive, less defect prone and more versatile processes for manufacturing microscale devices. In particularly preferred aspects, the methods described herein are used to fabricate microscale fluidic structures, also termed "microfluidic", within the body of a microfluidic device.

In one preferred aspect, photoimagable polymers are used as the intermediate polymer layer in which those structures are defined. In accordance with this aspect of the invention, devices are provided that include a first substrate layer having a photoimagable polymer layer deposited upon one surface. The photoimagable polymer is treated to provide one or more predetermined and desired microscale structures on the first surface. Overlaying and bonding the first surface of the first substrate with a second substrate then incorporates those structures within the interior portion of the body structure of the device, e.g., between the first and second substrate layers.

In a related aspect, an ablatable polymer is deposited upon a non-ablatable substrate layer, and portions of the intermediate polymer layer are removed by laser ablation. By a "non-ablatable substrate" is meant an underlying substrate that is not ablated under the conditions used to ablate the polymer layer, i.e., substantially higher energy is required for ablation of the underlying substrate than for the polymer layer. Because the underlying substrate is non-ablatable, it functions as a limit or 'etch-stop' for the ablation process at the energy level used to ablate the polymer layer, thereby providing consistency in terms of the depth of the ablation process.

In the case of a microfluidic device, e.g., incorporating an integrated microfluidic channel network, portions intermediate polymer layer is removed, e.g., through the photoimaging process or the laser ablation process, that correspond to the desired location of channels within the ultimate device, are removed from the first surface of the first substrate. This results in a network of grooves in the polymer layer on the first surface of the first substrate. A second substrate layer is overlaid on the first substrate to cover and seal the grooves and thereby define those grooves as fully enclosed channels or capillaries. Where the underlying substrate is not affected by the process of removing the polymer layer, that substrate forms a consistent bottom surface for the channels or chambers fabricated through the polymer layer. Specifically, the polymer layer provides the walls of the channels and/or chambers, while the underlying substrate forms the bottom surface of these channels and/or chambers. This provides advantages over typical photolithographic or laser ablation fabrication techniques, where variations in the etching or ablation processes can lead to substantial variations in the bottom surfaces of channels and chambers fabricated by these processes. Further such variations can have profound effects on the manipulation and analysis of materials within such channels, e.g., fluidic effects surface effects, and the like.

II. Devices and Methods of Fabrication

The present invention is generally useful in fabricating microscale structures on the surface of substrates or between two, bonded substrate layers. In particularly preferred aspects, the present invention involves methods of fabricating microfluidic devices that are comprised of a body structure having one or more microscale channels disposed within their interior.

As used herein, the term "microfluidic" generally refers to devices and systems that employ microscale fluidic elements, e.g., channels, chambers, or the like, in the movement, combination, separation and analysis of fluid samples. Such microscale fluidic elements typically have at least one interior cross sectional dimension, e.g., width, depth, diameter, etc., that is between about 0.1 $\mu$m and about 1000 $\mu$m. Microfluidic devices may be fabricated in a number of ways. For example, a number of discrete elements, such as chambers, capillaries, and the like, may be coupled together to provide a microfluidic device of a desired functionality, e.g., mixing, separation, etc. However, in preferred aspects, microfluidic devices are fabricated as integrated channel/chamber networks in solid substrates using well-known microfabrication techniques.

Microfluidic devices typically include a body structure that includes one or several integrated fluidic elements disposed within its interior. Such microfluidic devices have wide ranging applicability in a variety of fields, including biological and chemical research, pharmaceutical screening, chemical synthesis and analysis, diagnostics, environmental analysis and the like. In particularly preferred aspects, such devices are used in biological and biochemical analyses, including electrophoretic separations, e.g., DNA, RNA, proteins, etc., biological screening assays for pharmaceutical targets, and the like. Typically, such devices range from relatively simple channel designs, e.g., one or two connected microfluidic channels disposed in the body structure, to more complex channel networks that include more than 5, more than 10 and even more than 20 intersecting microfluidic channels that link. Some examples of microfluidic devices as well as their applications are described in Published International Patent Application Nos. WO 98/00231, WO 98/49548, WO 98/22811, and PCT US 99/13918, each of which is incorporated herein by reference for all purposes.

Preferred microfluidic devices are typically fabricated as an aggregate of planar substrate layers. A network of grooves and or depressions are fabricated onto or into one surface of the substrate, which network corresponds to the desired network of channels in the completed device. Fabrication of grooves onto or into the surface of the substrate has been accomplished a number of ways. For example, for silica-based substrates, e.g., glass, fused silica, silicon, quartz, etc., photolithographic methods and wet chemical etching are readily employed to etch the networks of groove and depressions into the surface of a silica substrate. For polymeric, e.g., plastic substrates, embossing and injection molding methods have been discussed as fabrication strategies to form planar substrates having these networks of grooves disposed in their surfaces, see, e.g., U.S. Pat. No. 5,885,470. A still further alternative is described in Published International Patent Application No. WO 99/29497, and incorporated herein by reference, where microfluidic structures are deposited upon the surface of a substrate using printing techniques, e.g., through printing of thermoplastic layers in a predefined pattern.

The present invention provides still a further alternative to the above-described fabrication techniques in that an intermediate polymer layer is provided between two solid substrate layers. The channel/chamber network is then selectively removed from the intermediate polymer layer. Removal of portions of the intermediate polymer layer may be accomplished by a number of microfabrication methods including, for example, wet or plasma etching processes. In particularly preferred aspects, however, the portions of the intermediate polymer layer are removed by photoimaging or laser ablation processes. In particularly preferred aspects, the removal process has no substantial structural effect on the underlying substrate surface, e.g., no depressions, channels, grooves or wells are produced in the underlying surface of the substrate as a result of the removal process.

In particularly preferred aspects, the underlying substrate layer upon which the polymer layer is deposited, is not affected by the process of removing the polymer layer. In particular, the removal process does not affect the removal of any portion of the surface of the underlying substrate layer.

A. Photoimagable Polymer Layer

As noted above, in at least one aspect, the present invention utilizes a layer of photoimagable polymer as the intermediate polymer layer in which the structural elements of the device are fabricated, e.g., microscale channels and chambers. As used herein, "photoimagable polymers" are polymeric materials that are susceptible to changes in their structure following exposure to electromagnetic radiation, e.g., light. These changes in structure give rise to an increased or decreased solubility of the polymer layer in the presence of certain chemical agents, also termed "developers." Developer solutions vary depending upon the nature of the photoimagable polymer used, and are generally commercially available from the same sources as the polymers themselves. In preferred aspects, the photoimagable polymers (also termed "resists") comprise negative resists, where exposure of the polymer to light of an appropriate wavelength renders the exposed polymer insoluble in a developer solution whereas unexposed regions are soluble. The unexposed regions are then dissolved in the developer, leaving those unexposed regions as "etched" depressions, grooves or wells in or through the polymer layer. Although not typically preferred, the present invention is also optionally practiced using photoimagable polymers that are positive resists, where the exposed regions are more soluble in the developer solution.

FIG. 1 schematically illustrates the general processes used in the present invention. Briefly, as shown in FIG. 1A, a substrate layer 100 is provided. A layer of photoimagable polymer 102 is applied to the surface of the substrate layer (see FIG. 1B). The photoimagable polymer layer is selectively exposed to light (as shown by arrows 104) of an appropriate wavelength (see FIG. 1C). Typically, exposing predefined regions of the polymer layer is carried out by shining an appropriate light source through a mask 106, that is partially opaque, but having transparent regions e.g., 108, that are provided in an appropriate pattern corresponding to the desired channel geometry, or a negative of the desired channel geometry, depending upon the type of resist used.

Figure 1D:
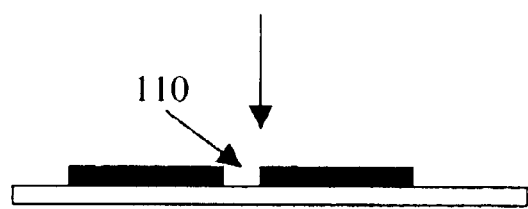
Figure 1E:
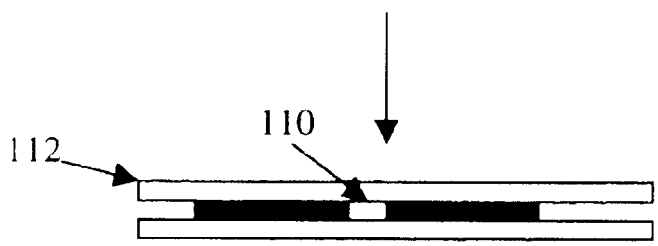
Figure 2A:
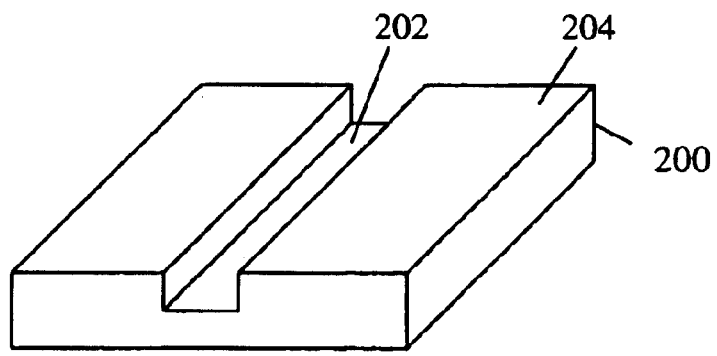
FIG. 2 is a schematic illustration of a further aspect of the present invention used in producing multilayer microfluidic channel networks.
Figure 2B:
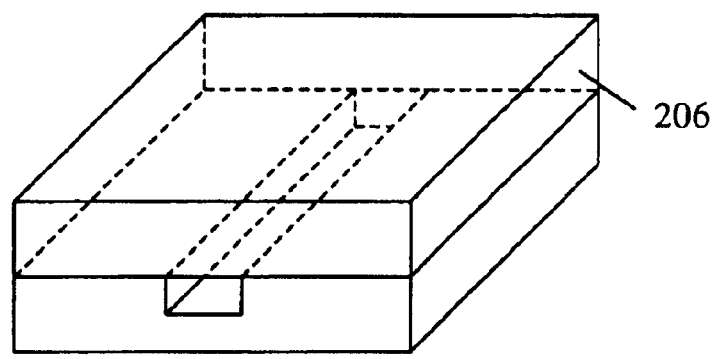
Figure 2C:
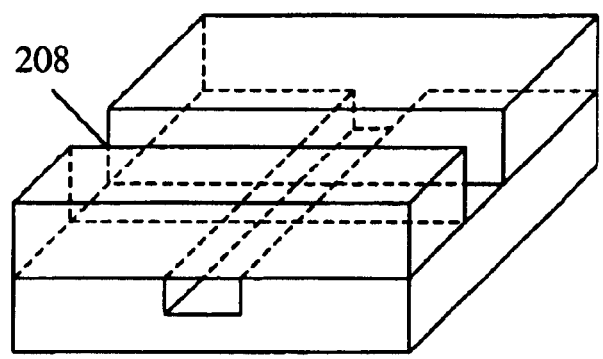
Figure 2D:
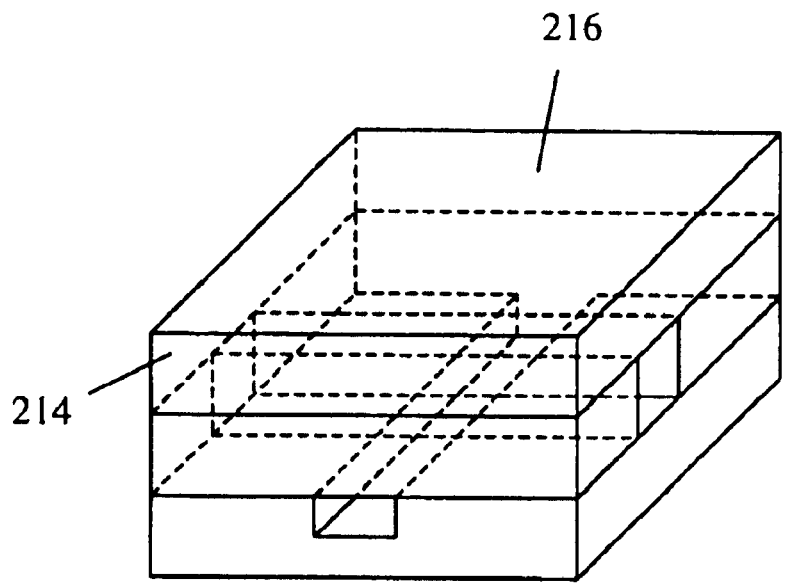
Figure 2E:
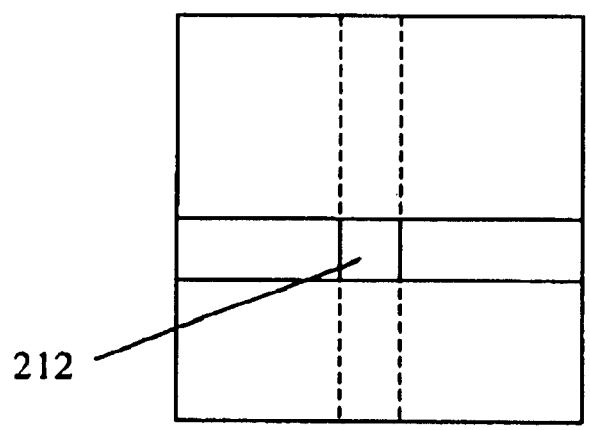

Depending upon the nature of the photoimagable polymer layer, e.g., as a negative or positive photoresist, the polymer layer is removed from either the exposed or the unexposed (as shown) regions of the substrate surface. As shown, the imaged polymer layer includes one or more grooves 110 corresponding to the removed material (FIG. 1D). A second substrate layer 112 is then mated and bonded to the polymer layer sandwiching the polymer layer between the first and second substrates (FIG. 1E). The grooves in the polymer layer are thereby sealed to define channels chambers and/or other structures within the interior of the layered structure or body of the resulting microfluidic device. Typically, one or more of the first and second substrate layers includes ports disposed through it, which ports are positioned to communicate with one or more off the channels in the resulting microfluidic device.

In accordance with the present invention, a wide variety of photoimagable polymers may be used such as photoimagable polyimides (e.g., PI-2729, available from HD M+icrosystems), photoimagable benzocyclobutenes (e.g., Cyclotene 4026 available from Dow Chemical), photoimagable epoxies (e.g., SU-8, available from MicroChem. Corp), Novolac based positive photoresists (e.g., AZ P-4000, available from Clarient), cardo type photopolymers (e.g., V-259-PA, available from Nippon Steel Chemical Co.), and the like. Such polymers are generally commercially available and are generally described in, e.g., Wayne M. Moreau, Semiconductor Lithography: Principles, Practices and Materials (Microdevices: Physics and Fabrication Technologies), which is incorporated herein by reference.

Provision of the photoimagable polymer layer upon the surface of the first substrate layer may be carried out by a number of methods. For example, for soluble polymers, liquid application methods may be used to coat the surface of the first substrate, including spin-coating methods, spray coating methods and simple immersion coating methods. These methods are typically followed by a step of baking the substrate at a moderately elevated temperature, e.g., from about 80° C. to about 100° C., to dry and secure the polymer layer onto the surface of the substrate. A variety of the most preferred photoimagable polymers, e.g., Cardo-DFR, a Cardo polymer (available from Nippon Steel Company) are commercially available in a sheet or film form and are typically applied by layering or laminating the sheet over the surface of the substrate. Once the polymer sheet is layered onto the substrate, the polymer is typically laminated to the surface of the substrate layer using a similarly elevated temperature, e.g., from about 80 to about 100° C., to adhere the polymer layer to the surface of the substrate. Typically, sheet polymers are preferred for their simple and inexpensive methods of application, as compared to the above-described coating techniques, as well as their ability to provide polymer layers of greater thickness. Thicker polymer layers are particularly useful in the production of larger cross section channels and chambers or channels/chambers with higher aspect ratios, e.g., greater than 1 (depth:width).

Once the polymer layer is coated onto the surface of the substrate, the polymer layer is exposed to an effective amount of electromagnetic radiation, e.g., light, at an appropriate wavelength and in a pattern reflective of the desired channel network in the finished device. The phrase "effective amount of electromagnetic radiation refers to light or other electromagnetic radiation at a wavelength, intensity and for a duration, sufficient to affect the structure of the photoimagable polymer throughout the exposed region and through the full thickness of the polymer layer. The step of exposing the polymer layer to electromagnetic radiation may be accomplished using masking techniques, where light is shown through a patterned mask to irradiate only selected portions of the polymer layer (see, e.g., FIG. 1C). Alternatively, laser writing techniques are used in which a laser is directed across the selected portions of the polymer layer to expose those portions to light. The former technique is particularly useful in large scale manufacturing of microfluidic devices, where large substrate wafers are simultaneously irradiated to produce multiple channel networks that can be separated into multiple individual microfluidic devices. The latter technique on the other hand, is particularly useful for rapidly fabricating smaller numbers of devices, e.g., rapid prototyping.

The appropriate wavelength for exposure of the polymer layer typically depends upon the polymer used. Typically, such polymers may be obtained with any of a variety of different effective wavelengths. Such wavelengths typically fall within the ultraviolet range, e.g., from about 190 nm to about 430 nm.

As described above, exposure of the polymer layer to electromagnetic radiation of an appropriate wavelength results in portions of the polymer layer that are more or less soluble in developing solutions (depending upon whether the polymer is a positive or negative resist). The exposed polymer layer is then treated or developed to remove portions of the layer to define the grooves that form the channels of the finished device. Typically, developing the polymer layer involves washing the polymer layer with an appropriate developing solution that dissolves the polymer layer in the selected exposed or unexposed regions. Such developing solutions generally comprise aqueous alkaline solutions or organic solvents, are typically selected depending upon the polymer layer used and are generally commercially recommended by and are available from the same commercial sources as the polymer materials.

Photoimageable polymer layers, in some cases, may present certain issues to detection systems used in conjunction with microfluidic channel systems. Specifically, some photoimageable polymers may exhibit fluorescence when excited by light of a certain wavelength. Typically, this presents no problems for detection as the detection excitation and emission detection are within the middle portions of channels, and far from the photopolymer walls. In some cases, however, this autofluorescence may interfere with optical detection of signals from within microscale channels fabricated in the photopolymer layer, by virtue of a wider excitation beam, etc.

Accordingly, in certain aspects a blocking layer, e.g., that blocks excitation and/or fluorescence emissions from the photopolymer layer, is incorporated between the polymer layer and the base substrate layer. This blocking layer can be etched or otherwise removed along the channel by using the photopolymer layer as a mask. For example, a glass substrate may be provided with a chrome layer disposed on its surface. The photoimageable polymer is then deposited over the chrome layer and imaged to provide the channel defining grooves. Because the photoimageable polymer layer is deposited in a chrome layer, the bottom of the channel grooves will be the chrome layer, which is not translucent. In order to provide optical access to the channel from this direction, a short etching step is optionally applied to the substrate. Because the photoimageable polymer has been developed and removed from the channel grooves, etching of the chrome layer will only occur in the channel grooves. This provides a pre-aligned slit in the chrome layer that corresponds to the channel. The remaining chrome layer, e.g., over the entire substrate except for the channels, is then blocked from this direction, allowing excitation and detection of emissions from the channel without interfering fluorescence from the blocked polymer layer.

In alternative aspects, the fluorescence of a polymer layer may be masked by incorporating a fluorescence absorbing or masking compound into the polymer layer. Examples of masking compounds include pigments, such as titanium dioxide and carbon black.

Although described as being deposited on the substrate, it will be appreciated that the substrate layer may include additional intermediate layers between the substrate, e.g., a glass layer, and the imageable polymer layer. By way of example, in some cases, photoimageable polymer layers fluoresce when exposed to appropriate radiation, e.g., light of an appropriate wavelength. In some instances, this fluorescence may interfere with detection.

B. Laser Ablated Polymer Layer

In a related although alternate aspect, the portions of the polymer layer are removed using laser ablation. In particular, the channels and/or chambers are removed from the polymer layer by directing an appropriate laser light at the appropriate portions of the polymer layer. Laser ablation of channels in the surface of polymeric substrates is described in detail in U.S. Pat. No. 5,571,410, which is incorporated herein by reference for all purposes. In accordance with the present invention, however, the ablation process removes the desired portions of the polymer layer down to the underlying substrate. In accordance with this aspect of the invention, the underlying substrate is typically selected so as not to be affected by the ablation process. Accordingly, the depth of the channels and/or chambers is fixed by the underlying substrate.

A variety of different ablatable polymers are generally commercially available, and include polymers typically used in fabrication of microfabricated structures, e.g., polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, acrylonitrile-butadiene-styrene copolymer, and the like. Laser ablation conditions for a variety of different materials are well known to those of skill in the art and are described in detail in, e.g., Laser Ablation: Principles and Applications, Springer Series in Material Science vol. 28, John C. Miller ed. (1994). In the ablation process a precisely defined laser beam is used to remove the polymer through a combination of thermal and photo decomposition. The selected wavelength of the laser is chosen in a range where the polymer most absorbs to maximize effectiveness. The energy of the beam has to be above a minimum threshold to ensure ablation (normally>50 millijoules/cm$^2$) but below that which damages the substrate (normally>1 joule/cm$^2$).

The first and second solid substrate layers, e.g., those layers between which the polymer layer is disposed in the finished device, may be selected from a variety of different types of materials, provided that they are compatible with the process used in fabricating the channels into the polymer layer as described above (e.g., the substrate layer underlying the ablatable polymer layer is, itself, not ablated under the ablation process used), as well as being compatible with the ultimate desired use of the finished microfluidic device. In particular, in most uses the substrate layer functions primarily as a support for the polymer layer, and as a result, forms the bottom surface of the resulting channels and/or chambers. As such, selection of the substrate layers depends primarily upon the compatibility of those substrates with the fabrication process and ultimate application of the device. For example, typically, the first or underlying substrate layer may be selected from any of the polymeric or silica-based substrate materials described herein. However, where the laser ablation methods of the invention are used, any underlying substrate layer should be non-ablatable under the ablation conditions. This is typically accomplished by using a silica-based substrate as the underlying substrate. However, in some cases polymer substrates may be used underlying the ablatable polymer layer, provided that the underlying polymer layer is non-ablatable under the conditions used to ablate the ablatable polymer layer.

Although primarily functioning as a support for the polymer layer, it will be appreciated that the first and second substrate layers optionally provide fluidic elements, e.g., channels, ports, chambers or the like, in the finished device. Specifically, in one example, a channel network is laid out as a series of grooves on the surface of the first substrate layer. The polymer layer is overlaid upon the surface of the first substrate to seal and define the channels in the first substrate. A second channel network is then laid out in the polymer layer by the methods of the present invention, which will intersect and communicate with the first channel network at points at which the channels cross. Such multi-layer microfluidic channel networks add to the complexity of operations to which such microfluidic devices may be put. The second substrate layer is then overlaid upon the polymer layer to seal and define those channels. Optionally, additional fluidic elements, e.g., channels, ports etc., are provided in the surface of the second substrate that contacts the polymer layer.

An example of the application of the methods described herein to fabrication of multilayer microfluidic devices is illustrated in FIG. 2. As shown in FIG. 2A, a first substrate layer 200 is provided having a first channel or channels 202 fabricated into its surface 204. The intermediate polymer layer 206 is disposed over the surface 204 of the first substrate 202, sealing and defining channel 202 (FIG. 2B). A second channel or channel network 208 is then fabricated into the intermediate polymer layer 206 (FIG. 2C). Because the second channel or channel network 208 is fabricated entirely through the intermediate polymer layer 206, at points where the second channel network 208 crosses the underlying first channel network 202, it will be in fluid communication with the underlying channel network 202, e.g., at intersection 212 (FIG. 2C, and FIG. 2E which shows the channel intersection from a top view). A second substrate layer 214 is then mated with the intermediate polymer layer 206 to seal the second channel or channel network 208. Additional fluidic elements are optionally provided in the bottom surface of the second substrate layer 214. Optional additional intermediate polymer layers may also be provided to provide still further layers in which channels or chambers may be provided, e.g., on the upper surface 216 of second substrate layer 214. For example, additional layers (polymer or other substrates) may be provided between two polymer layers to permit crossing over of two channels that are on different layers. In some cases, the intermediate layer comprises an additional polymer layer that is ablated or developed so that the channels will cross-over at certain points while optionally providing a passage for fluid connection between the channels at other points.

Typically, the first and second substrate layers are independently selected from a variety of different substrate types. For example, such substrates may comprise silica-based substrates such as glass, quartz, silicon or the like. Similarly, polymeric substrates are equally useful in these applications. Examples of preferred polymer materials include, e.g., polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, and acrylonitrile-butadiene-styrene copolymer, and the like. For a discussion of polymeric materials useful in microfluidic applications, see, e.g., U.S. Pat. No. 5,885,470, incorporated by reference herein. In the case where the substrate layers provide fluidic elements to the overall device, i.e., function as more than merely a support structure, standard microfabrication methods are generally used to produce those fluidic elements, e.g., photolithography and wet chemical etching for silica based substrates, injection molding, embossing and laser ablation methods for polymeric substrates.

As noted, the first and second substrates may comprise the same materials or optionally, may be selected from different materials, depending upon the needs of the ultimate device or the applications to which it is to be put. In preferred aspects, at least one of the first and second substrates is transparent, in order to facilitate detection of optical signals within the channels of the device. In certain aspects, each of the substrate layers comprises a silica-based material, while in optional alternative aspects, each of the substrate layers is comprised of a polymeric material, while in still a further aspect, one substrate layer comprises a silica-based substrate while the other substrate layer is a polymeric material. The description herein of first and second substrate layers generally refers to the substrate layers that are mated with the photoimagable polymer layer. It will be appreciated that the microfluidic devices described herein may incorporate more than two substrate layers, and in fact, more than one photoimagable polymer layer, depending upon the needs of the device that is being produced.

The second substrate layer is typically bonded to the polymer layer using mildly elevated temperatures and optionally, moderate applied pressure. In particular, the polymer layer itself, often functions as an adhesive at elevated temperatures, to bond the second substrate layer to the first via the polymer layer. Such bonding typically takes place under conditions similar to those used to adhere polymer films to the first substrate layer, e.g., at temperatures from about 80° C. to about 400° C. Although many polymer substrates may be bonded at the lower end of the above-described temperature range, e.g., from about 80° C. to about 200° C., depending upon the polymer type, applied temperatures may be higher, e.g., from about 200° C. to about 400° C. In either event, under these elevated temperatures, the second substrate is pressed onto the polymer layer, the assembly is cooled and the second substrate is thereby bonded to the polymer layer. Accordingly, the polymer layer functions both to provide the internal structural elements of the microfluidic device, as well as provides an adhesive or bonding layer for the second substrate layer. In some instances, an additional adhesive is applied to the surface of the polymer layer to bond the second substrate thereto. In such cases, a variety of different adhesive types may be used, provided they are compatible with both the fabrication process and the application to which the device is to be put. Typically, thermally or UV curable adhesives are preferred for use in these applications. Such adhesives are generally commercially available and are known to those of ordinary skill in the art.

Because the methods of the present invention permit bonding at relatively low temperatures, e.g., as compared to direct thermal bonding of glass substrates, these methods are far less sensitive to defects in the substrate layers. In particular, in thermal bonding of glass substrates, temperatures well in excess of 500° C. are typically used to bond substrates. At these temperatures, the presence of any particulate matter between the substrate layers generally has disastrous effects upon the bonding process when the particles or the air pocket surrounding them expands in the heated environment. This failure mode is exacerbated further by the presence of moisture on or within the particulate contaminants, which will 'outgas' at the elevated temperatures required for bonding glass substrates. Such outgassing creates voids at the interface of the bonded parts, with results that range from a partial to a total failure of the bonding process.

In addition to reducing the sensitivity to defects, lower temperature bonding processes also permit the simplified use of surface coatings within the microfluidic elements of the device. In particular, with lower temperature bonding, surface coatings can be applied prior to assembly of the device, thereby facilitating the coating process relative to methods which involve pumping the coating reagents through the microscale channels of the finished device. The surface coatings are better able to survive the lower temperature bonding process, as compared to extremely high temperature bonding processes used, e.g., for direct thermal bonding of glass substrates.

In particular, it is often desirable to coat the surfaces of the channels and other microfluidic elements within a microfluidic device, to alter interactions of the surface with the materials being transported through the device. For example, in capillary electrophoretic methods, it is often desirable to mask surface charges that are present on the surfaces of the capillary channels, in order to eliminate or substantially reduce electroosmotic flow of fluids through those channels. Further, in other applications, surface properties may contribute to the preferential adsorption of reagents on channel walls. This is particularly problematic in channels through which proteins and cells are being transported. Such adsorption can materially alter the make-up of the reagent streams and thereby alter the analyses being carried out therein.

A variety of surface coatings can be used to coat the relevant surfaces of the microfluidic devices described herein through either covalent, hydrophilic or charge-based interactions. For example, surface modifications have employed: polyethylene glycol or polyethylineimine polymers (see, e.g., Huang et al., J. Microcol. Sep., 4:135–143 (1992); Bruin et al., J. Chromatog. 471:429–436 (1989); and Erim et al., J. Chromatog., 708:356–361 (1995)); polyethyleneglycol-like epoxy polymers functionalized with pendent hydroxy groups attached to silica surfaces (Towns et al., J. Chromatog., 599:227–237 (1992)); polyacrylamide (Hjerten, J. Chromatog., 347:191 (1985)); glycol groups (Jorgenson, Trends in Anal. Chem. 3:51 (1984)); polysiloxanes and glyceroglycidoxypropyl coatings (McCormick, Anal. Chem., 60:2322 (1998)).

Fabrication costs for microfluidic devices are also reduced by the present invention. In particular, in addition to cost savings that come from the reduction of defects, the use of the intermediate photopolymer layer reduces costs of materials associated with manufacturing. In particular, by permitting simple surface treatments, one can reduce the need for expensive substrate materials such as glass or quartz, opting instead for less expensive polymeric substrates. Similarly, in the methods and devices of the present invention, less expensive glass substrates may be used that would be otherwise unsuitable for etching and direct thermal bonding processes, due to impurities within the glass and surface roughness, respectively.

In the case of photoimagable polymers, the methods described herein are also particularly useful in producing microscale structures, e.g., channels, chambers, etc. with relatively high aspect ratios, e.g., where a channel is deeper than it is wide. In particular, in typical photolithographic processes the substrates are etched uniformly in all directions from the point of contact with the substrate, yielding channels having trapezoidal cross-sections that are wider than deep. However, the photoimagable polymers yield channels having straight walls that are limited in depth only by the thickness of the polymer layer. Thus, one can provide channels that are much deeper than wide. In particular, the channels of the devices fabricated in accordance with the present invention optionally have aspect ratios, e.g., depth:width, greater than 1, greater than 2, often greater than 5 and in many cases, greater than 10 or more. Advantages of channels with such aspect ratios are generally described in U.S. Pat. No. 5,842,787, incorporated herein by reference for all purposes.

III. Integrated Systems

The microfluidic devices described herein are typically used in conjunction with other instrumentation as an integrated system. In particular, the devices are typically operably coupled to control and detection instrumentation that controls movement of material through and among the channels of the microfluidic devices in a controlled fashion, and detects results of the operations that are being performed therein.

Control of material movement through the channels and/or chambers of the devices may be carried out by a variety of methods. For example, in certain applications, e.g., electrophoretic analyses, electrokinetic material transport systems are used. Such electrokinetic transport systems selectively apply electric fields across one or more of the channels of the device simultaneously or at selected different times, to drive material movement through the channels by electrophoresis and/or electroosmosis. Controlled electrokinetic transport processes are described in detail in, e.g., U.S. Pat. Nos. 5,800,690 and 5,858,195, each of which is incorporated herein by reference. Pressure, vacuum or capillary driven material transport systems are also optionally employed to direct materials through the channels of the device in a controlled fashion. In particular, material flow is driven by pressure differentials selectively applied across the various channels of the device. These pressure differentials are optionally created by applying positive or negative pressures at one or more ports of the device. Alternatively, capillary or wicking forces are used to draw material flow through the channels of the device. Examples of devices and systems using these pressure or capillary forces are described in, e.g., U.S. patent application Ser. No. 09/238,467, filed Jan. 28, 1999, and U.S. patent application Ser. No. 09/245,627, filed Feb. 5, 1999, each of which is incorporated herein by reference.

Typically, the integrated systems of the invention include a detection system that is in sensory communication with one or more channels of the microfluidic device. Detection systems for use in conjunction with the devices described herein also may take a variety of forms. For example, detection of results of a desired operation may involve optical detection, electrical detection, electrochemical detection, chemical detection or the like. As used herein, the phrase "in sensory communication" refers to a detection system that is positioned to receive a detectable signal from the channel of the device. For example, in the case of optical detection, a detector is typically positioned adjacent a transparent region of one or more channels of the device, and appropriately directed such that the detector, e.g., the collection optics of the detector, receive the optical signal from the channel. For chemical or electrochemical detection systems, sensory communication often requires that the sensor aspect of the detection system be positioned in direct contact with the materials within the channel of the device.

In preferred aspects, optical detection is used to detect an optical signal from a reaction of interest. Such optical signals include chemiluminescent signals, fluorescent signals and colorimetric signals. In particularly preferred aspects, fluorescence detection systems are used. Such systems typically include an excitation light source, an optical train for directing the light source at the one or more channels of the device, and for collecting emitted fluorescence and separating it from reflected excitation light, and light sensors or detectors for quantifying the amount of fluorescence emitted, e.g., photodiodes, PMTs, CCDs, etc.

The controllers and detectors of the system are also typically operably coupled to a processor or computer which instructs the controller element in accordance with a preprogrammed material flow profile, and which receives, analyzes, records and displays detector data, e.g., results of the desired operation.

Figure 3:
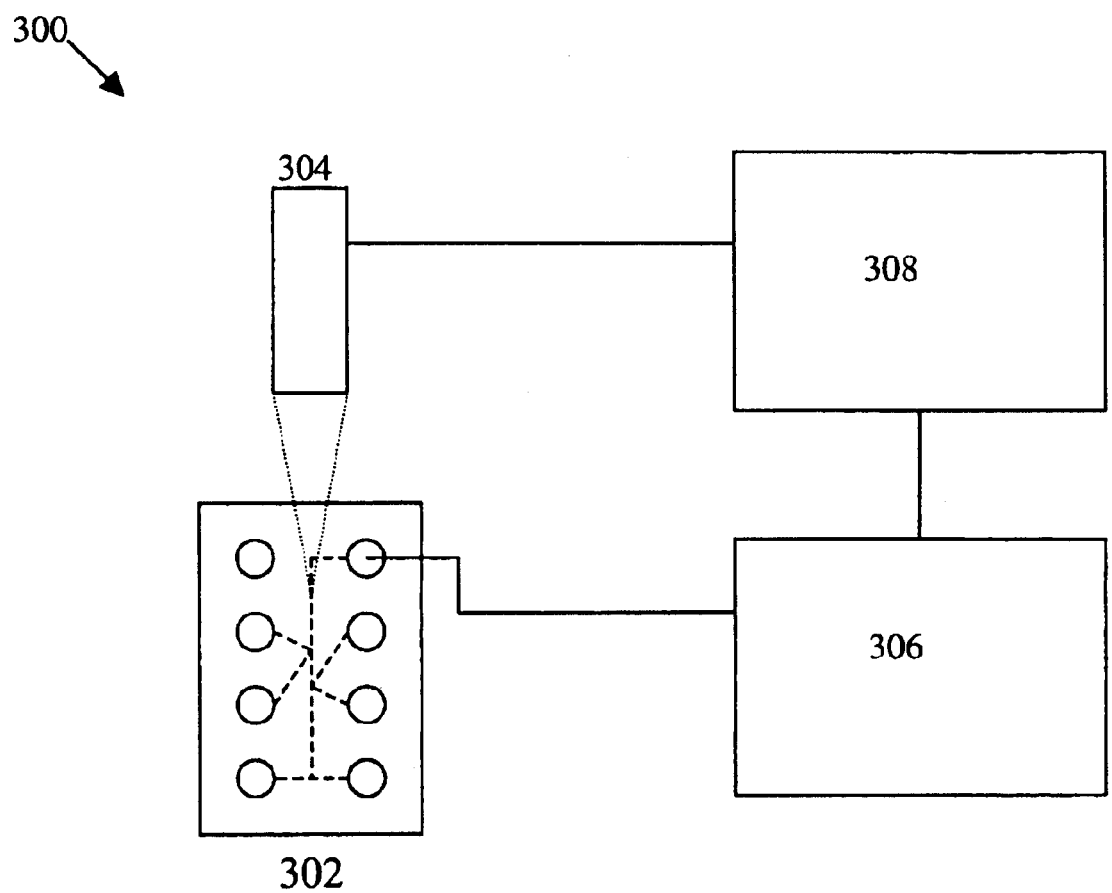
FIG. 3 is a schematic illustration of an integrated microfluidic analysis system.

An exemplary integrated system is illustrated in FIG. 3. As shown, the system 300 includes a microfluidic device 302. A controller 304 is operably coupled to the microfluidic device, e.g., electrically via electrodes, or from a pressure source via pressure conduits. A detector 306 is also provided within sensory communication with at least one of the channels of the microfluidic device 302. A computer 308 is also shown operably coupled to the controller and detector. The computer 308 typically includes appropriate software programming, e.g., loaded into RAM, in a hard drive, on a CD ROM, imported via the internet or an intranet, or the like, that instructs the processes of instructing the controller to move material through the device in accordance with a preprogrammed flow profile. The software also typically instructs the computer in the process of receiving, recording and analyzing the data received from the detector.

All publications and patent applications are herein incorporated by reference to the same extent as if each individual publication or patent application was specifically and individually indicated to be incorporated by reference. Although the present invention has been described in some detail by way of illustration and example for purposes of clarity and understanding, it will be apparent that certain changes and modifications may be practiced within the scope of the appended claims. Generally, method steps may be performed in any order regardless of the order in which such steps are provided, unless a specific order is expressly provided or is clear from the context of the listed steps.

What is claimed is:

1. A method of manufacturing a microfabricated channel network, comprising:
   providing a first planar substrate having a first surface;
   depositing a first polymer layer on the first surfice of the first substrate;
   removing a first portion of the polymer layer to expose an area of the first surface of the first substrate, removal of the first portion of the polymer layer providing one or more grooves in the polymer layer that correspond to a desired channel pattern; and
   overlaying a second planar substrate layer on the polymer layer to seal the one or more grooves in the polymer layer as one or more channels in the desired channel pattern.

2. The method of claim 1, wherein the first polymer layer comprises a photoimagable polymer layer, and the removing step comprises:
   exposing first selected regions of the photoimagable polymer layer to effective levels of electromagnetic radiation, the selected regions either corresponding to the first portion of the first polymer layer or corresponding to the first polymer layer immediately surrounding but not including the first portion; and
   removing the first portion of the photoimagable polymer layer.

3. The method of claim 2, wherein the photoimagable polymer comprises a positive photoresist, and wherein the selected regions exposed in the exposing step correspond to the first portion of the first polymer layer.

4. The method of claim 2, wherein the photoimagable polymer comprises a negative photoresist, and wherein the selected regions exposed in the exposing step correspond to the polymer layer immediately surrounding but not including the first portion.

5. The method of claim 2, wherein the exposing step comprises directing a light source at the photoimagable polymer layer through a mask, the mask comprising transparent regions that correspond to the one or more channels of the desired channel pattern.

6. The method of claim 2, wherein the exposing step comprises movably directig the light source at different portions of the photoimagable polymer layer.

7. The method of claim 6, wherein the light source comprises a coherent light source.

8. The method of claim 6, wherein the light source comprises a laser.

9. The method of claim 2, wherein the photoimagable polymer is selected from photoimagable polyimides, photoimagable benzocyclobutenes, photoimagable epoxies, novolac based positive photoresists, and cardo type photopolymers.

10. The method of claim 2, wherein the depositing step comprises spin coating the photoimagable polymer onto the first surface.

11. The method of claim 2, wherein the depositing step comprises laminating the photoimagable polymer onto the first surface.

12. The method of claim 2, wherein the depositing step comprises spray coating the photoimagable polymer onto the first surface.

13. The method of claim 2, wherein the photoimagable polymer layer is between about 1 $\mu$m and about 100 $\mu$m thick.

14. The method of claim 2, wherein the photoimagable polymer layer is been about 5 $\mu$m and about 50 $\mu$m thick.

15. The method of claim 2, wherein the irradiating step comprises directing light at the predefined locations of the photoimagable polymer layer, the light comprising light of a wavelength between about 190 nm and about 430.

16. The method of claim 2, wherein the overlaying step comprises bonding the second substrate layer to the layer of photoimagable polymer.

17. The method of claim 16, wherein the photoimagable polymer layer comprises an adhesive surface and the bonding step comprises pressing the second substrate layer to the layer of photoimagable polymer.

18. The method of claim 1, comprising providing a groove in the first surface of the first substrate.

19. The method of claim 18, wherein the groove in the first surface of the first substrate intersects and is in fluid communication with the groove in the first polymer layer.

20. The method of claim 1, wherein a first surface of the second substrate is overlaid on the polymer layer, and further comprising:
   depositing a second polymer layer on a second surface of the second substrate opposite the first surface of the second substrate;
   removing a first portion of the second polymer layer to expose an area of the second surface of the second substrate, removal of the first portion of the second polymer layer providing one or more grooves in the second polymer layer that correspond to the desired channel pattern; and
   overlaying a third planar substrate layer on the second polymer layer to seal the one or more grooves in the second polymer layer as one or more channels in the desired channel pattern.

21. The method of claim 1, wherein the polymer layer comprises a laser ablatable polymer layer, the first substrate comprises a non-ablatable substrate, and the removing step comprises laser ablating the first portion of the polymer layer to expose an area of the first surface of the first substrate.

22. The method of claim 21, wherein the polymer layer is selected from polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, and acrylonitrile-butadiene-styrene copolymer.

23. The method of claim 21, wherein the first substrate is selected from glass, quartz, fused silica and silicon.

24. The method of claim 21, wherein the first substrate comprises a non-ablatable polymeric substrate that is not ablated under conditions used in ablation of the polymer layer.

25. A microfluidic device, comprising:
a first substrate layer having a first surface;
a first photoimagable polymer layer on the first surface of the first substrate, the photoimagable polymer layer having at least a first groove disposed therein in a desired location; and
a second planar substrate layer having a first surface, the first surface of the second substrate layer mated with and overlaying the photoimagable polymer layer.

26. The microfluidic device of claim 25, wherein at least one of the first and second planar substrates comprises glass.

27. The microfluidic device of claim 25, wherein at least one of the first and second planar substrates comprises a polymeric material.

28. The microfluidic device of claim 25, wherein the photoimagable polymer layer comprises a photoimagable polymer selected from photoimagable polyimides, photoimagable benzocyclobutenes, photoimagable epoxies, novolac based positive photoresists, and cardo type polymers.

29. The microfluidic device of claim 28, wherein the photoimagable polymer comprises an adhesive upper surface.

30. The microfluidic device of claim 25, wherein the photoimagable polymer layer is between about 1 and about 100 $\mu$m thick.

31. The microfluidic device of claim 25, wherein the layer of photoimagable polymer comprises a plurality of grooves disposed therein.

32. The microfluidic device of claim 31, wherein the plurality of grooves comprises at least two intersecting grooves.

33. The microfluidic device of claim 25, wherein the first and second substrate layers are selected independently from silica based substrates, polymer substrates and ceramic substrates.

34. The microfluidic device of claim 25, wherein at least one of the first and second substrates is selected from glass, quartz, fused silica and silicon.

35. The microfluidic device of claim 25, wherein at least one of the first and second substrates is selected from polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, acrylonitrile-butadiene-styrene copolymer.

36. The microfluidic device of claim 25, wherein the polymer layer is between about 1 and 100 $\mu$m thick.

37. The microfluidic device of claim 25, wherein the polymer layer is between about 5 and about 50 $\mu$m thick.

38. The microfluidic device of claim 25, wherein the groove comprises an aspect ratio (depth:width) greater than 1.

39. The microfluidic device of claim 25, wherein the groove comprises an aspect ratio (depth:width) greater than 2.

40. The microfluidic device of claim 25, wherein the groove comprises an aspect ratio (depth:width) greater than 5.

41. The microfluidic device of claim 25, wherein the groove comprises an aspect ratio (depth:width) greater than 10.

42. The microfluidic device of claim 25, further comprising a second groove disposed in at least one of the first surface of the first substrate or the first surface of the second substrate.

43. The microfluidic device of claim 42, wherein the second groove intersects and is in fluid communication with the fist groove in the polymer layer.

44. The microfluidic device of claim 25, further comprising:
a second photoimagable polymer layer disposed on a second surface of the second substrate opposite the first surface of the second substrate, the second photoimagable polymer layer having at least a second groove disposed therein in a desired location; and
a third planar substrate layer having a first surface, the first surface of the third substate layer mated with and overlaying the second photoimagable polymer layer.

45. A microfluidic device, comprising:
a first non-ablatable substrate layer having a first surface;
a first ablatable polymer layer on the first surface of the first substrate, the polymer layer having at least a first groove laser ablated entirely through the polymer layer in a desired location without affecting the first surface of the first substrate; and
a second planar substrate layer having a first surface, the first surface of the second substrate layer mated with and overlaying the first ablatable polymer layer.

46. The microfluidic device of claim 45, wherein the first substrate comprises glass.

47. The microfluidic device of claim 45, wherein the polymer layer is selected from polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, acrylonitrile-butadiene-styrene copolymer.

48. The microfluidic device of claim 45, wherein at least one of the first and second planar substrates comprises a non-ablatable polymeric material.

49. The microfluidic device of claim 45, wherein the polymer layer comprises a plurality of grooves laser ablated therethrough.

50. The microfluidic device of claim 49, wherein the plurality of grooves comprises at least two intersecting grooves.

51. The microfluidic device of claim 45, wherein the first and second substrate layers are selected independently from silica based substrates, polymer substrates and ceramic substrates.

52. The microfluidic device of claim 45, wherein at least one of the first and second substrates is selected from glass, quartz, used silica and silicon.

53. The microfluidic device of claim 45, wherein at least one of the first and second substrates is selected from polymethylmethacrylate, polycarbonate, polytetrafluoroethylene, polyvinylchloride, polydimethylsiloxane, polysulfone, polystyrene, polymethylpentene, polypropylene, polyethylene, polyvinylidine fluoride, acrylonitrile-butadiene-styrene copolymer, provided that if the first substrate is non-ablatable under conditions in which the polymer layer is ablated.

54. The microfluidic device of claim 45, further comprising a second groove disposed in at least one of the first surface of the first substrate or the first surface of the second substrate.

55. The microfluidic device of claim 54, wherein the second groove intersects and is in fluid communication with the first groove in the polymer layer.

56. The microfluidic device of claim 45, further comprising:
- a second ablatable polymer layer disposed on a second surface of the second substrate opposite the first surface of the second substrate, the second ablatable polymer layer having at least a second groove disposed therein in a desired location; and
- a third planar substrate layer having a first surface, the first surface of the third substate layer mated with and overlaying the second ablatable polymer layer.

57. An analytical system, comprising:
a microfluidic device, comprising:
- a first substrate layer having a first surface;
- a first photoimagable polymer layer on the first surface of the first substrate, the photoimagable polymer layer having one or more grooves disposed therein in a desired location; and
  - a second planar substrate layer having a first surface, the first surface of the second substrate layer mated with and overlaying tbe photoimagable polymer layer sealing the one or more grooves to define one or more microscale channels;
- a material transport system for directing movement of material through the one or more microscale channels, and
- a detector for detecting signals from the material.

58. The method of claim 1, further comprising the step depositing a blocking layer between the first planar substrate and the first polymer layer.

59. The method of claim 1, further comprising the step of incorporating a fluorescence absorbing or masking compound into the first polymer layer.

60. The microfluidic device of claim 25, further comprising a blocking layer disposed between the first substrate layer and the first photoimagable polymer layer.

61. The microfluidic device of claim 25, wherein the photoimagable polymer layer comprises a fluorescence absorbing or masking compound.

\* \* \* \* \*